(12) United States Patent
Hayashi et al.

(10) Patent No.: US 10,325,793 B2
(45) Date of Patent: Jun. 18, 2019

(54) METHOD FOR PRODUCING CRYSTAL SUBSTRATE

(71) Applicant: SCIOCS COMPANY LIMITED, Ibaraki (JP)

(72) Inventors: Masahiro Hayashi, Kanagawa (JP); Chiharu Kimura, Miyagi (JP)

(73) Assignee: SCIOCS COMPANY LIMITED, Ibaraki (JP)

( * ) Notice: Subject to any disclaimer, the term of this patent is extended or adjusted under 35 U.S.C. 154(b) by 0 days.

(21) Appl. No.: 15/600,937

(22) Filed: May 22, 2017

(65) Prior Publication Data
US 2017/0345694 A1 Nov. 30, 2017

(30) Foreign Application Priority Data

May 27, 2016 (JP) .................................. 2016-106551

(51) Int. Cl.
| | |
|---|---|
| *H01L 21/673* | (2006.01) |
| *H01L 21/67* | (2006.01) |
| *H01L 21/683* | (2006.01) |
| *H01L 21/687* | (2006.01) |
| *C30B 29/38* | (2006.01) |
| *C30B 29/64* | (2006.01) |
| *H01L 33/00* | (2010.01) |
| *H01L 33/16* | (2010.01) |

(52) U.S. Cl.
CPC .. *H01L 21/67309* (2013.01); *H01L 21/67011* (2013.01); *H01L 21/67242* (2013.01); *H01L 21/67353* (2013.01); *H01L 21/6835* (2013.01); *H01L 21/6836* (2013.01); *H01L 21/68735* (2013.01); *C30B 29/38* (2013.01); *C30B 29/64* (2013.01); *H01L 33/0095* (2013.01); *H01L 33/16* (2013.01); *H01L 2221/68327* (2013.01)

(58) Field of Classification Search
CPC combination set(s) only.
See application file for complete search history.

(56) References Cited

U.S. PATENT DOCUMENTS

| | | | |
|---|---|---|---|
| 2008/0057608 A1* | 3/2008 | Ishibashi | B24B 37/04 438/42 |
| 2013/0082279 A1* | 4/2013 | Faurie | H01L 21/3245 257/76 |
| 2013/0243680 A1 | 9/2013 | Hayashi et al. | |

FOREIGN PATENT DOCUMENTS

| | | |
|---|---|---|
| JP | 2001-196632 | 7/2001 |
| JP | 3581145 | 7/2004 |
| JP | 2004-327655 | 11/2004 |
| JP | 2004-356609 | 12/2004 |
| JP | 2005-136167 | 5/2005 |
| JP | 2007-331973 | 12/2007 |
| JP | 2009-029662 | 2/2009 |

(Continued)

*Primary Examiner* — Erin F Bergner
(74) *Attorney, Agent, or Firm* — Cooper & Dunham LLP

(57) ABSTRACT

A method for producing a crystal substrate includes preparing, measuring, holding, and machining. The preparing prepares a crystal substrate body including a curved crystal lattice plane. The measuring measures a shape feature of the crystal lattice plane. The holding holds the crystal substrate body in a warped state in accordance with the shape feature measured by the measuring, to more flatten the crystal lattice plane than the crystal lattice plane at the preparing. The machining machines a surface of the crystal substrate body held in the warped state, to flatten the surface.

15 Claims, 7 Drawing Sheets

(56) References Cited

FOREIGN PATENT DOCUMENTS

| JP | 2011-151151 | 8/2011 |
| JP | 2013-173675 | 9/2013 |
| JP | 2013-203653 | 10/2013 |
| JP | 2014-131005 | 7/2014 |

\* cited by examiner

METHOD FOR PRODUCING CRYSTAL SUBSTRATE

CROSS-REFERENCE TO RELATED APPLICATIONS

This patent application is based on and claims priority pursuant to 35 U.S.C. § 119(a) to Japanese Patent Application No. 2016-106551, filed on May 27, 2016, in the Japan Patent Office, the entire disclosure of which is hereby incorporated by reference herein.

BACKGROUND

Technical Field

Aspects of the present disclosure relate to a method for producing a crystal substrate.

Related Art

Properties of a crystal substrate used in a semiconductor device change, depending on, for example, the uniformity of a crystal lattice arrangement, the smoothness of a substrate surface, and the presence or absence of warp of the substrate.

As an index on the properties of a crystal substrate, there is an off-angle that is an angle formed by a substrate surface and a crystal lattice plane. The off-angle changes with, for example, a state of a crystal lattice, such as the growth direction of the crystal, and a state of the substrate surface, such as cutout angle, warp, or surface treatment. Accordingly, the off-angle may be distributed over the entire substrate surface. Since the distribution of the off-angle may affect the performance of the crystal substrate and a product including the crystal substrate, it is preferable to reduce the off-angle where possible.

SUMMARY

In an aspect of the present disclosure, there is provided a method for producing a crystal substrate that includes preparing, measuring, holding, and machining. The preparing prepares a crystal substrate body including a curved crystal lattice plane. The measuring measures a shape feature of the crystal lattice plane. The holding holds the crystal substrate body in a warped state in accordance with the shape feature measured by the measuring, to more flatten the crystal lattice plane than the crystal lattice plane at the preparing. The machining machines a surface of the crystal substrate body held in the warped state, to flatten the surface.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

Figure 1:
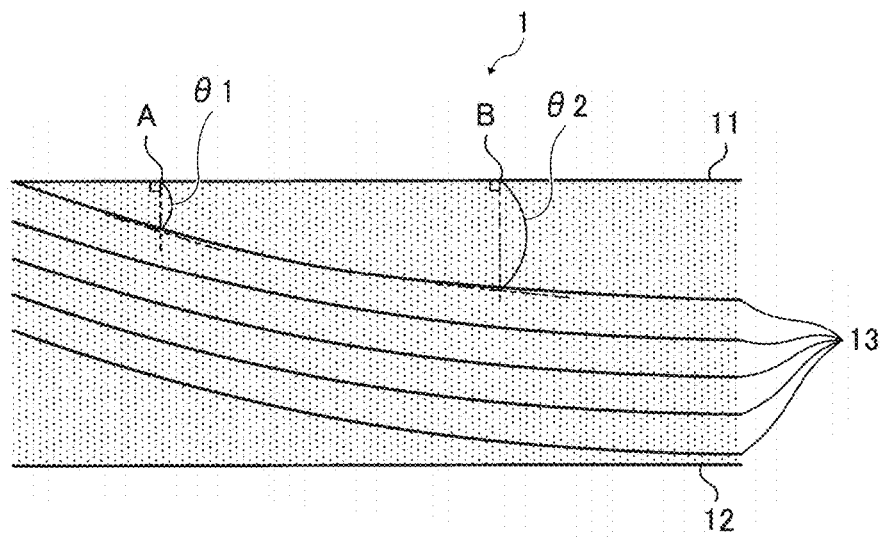
FIG. 1 is an illustration of an internal structure of a crystal substrate according to an embodiment.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

In a later-described comparative example, embodiment, and exemplary variation, for the sake of simplicity like reference numerals are given to identical or corresponding constituent elements such as parts and materials having the same functions, and redundant descriptions thereof are omitted unless otherwise required. As used herein, the singular forms "a", "an", and "the" are intended to include the plural forms as well, unless the context clearly indicates otherwise.

Referring now to the drawings, embodiments of the present disclosure are described below.

FIG. 1 is an illustration of an internal structure of a crystal substrate body 1 according to an embodiment of the present disclosure. FIG. 1 is a schematic view of a part of a cross-section of the crystal substrate body 1, and illustrates shape features, an arrangement relation, and the like of main constituent elements. FIG. 1 illustrates a front surface 11, a back surface 12, a crystal lattice plane 13, a first off-angle $\theta 1$, and a second off-angle $\theta 2$ of the crystal substrate body 1.

The off-angles $\theta 1$ and $\theta 2$ are angles formed by the front surface 11 (a tangential plane of the front surface 11 when the front surface 11 is a curved surface) and the crystal lattice plane 13 (a tangential plane of the crystal lattice plane 13 when the crystal lattice plane 13 is a curved surface). The crystal lattice plane 13 according to the example is a curved surface, that is, a curved surface having different curvatures depending on places. Therefore, the off-angles $\theta 1$ and $\theta 2$ are different values depending on the places to be measured. That is, the off-angles $\theta 1$ and $\theta 2$ have distributions in the region of the front surface 11. In this example, the curvature of the crystal lattice plane 13 corresponding to a point A on the front surface 11 is larger than the curvature of the crystal lattice plane 13 corresponding to a point B. In this case, the first off-angle θ1 corresponding to the point A is larger than the second off-angle θ2 corresponding to the point B (θ1>θ2).

Figure 2:
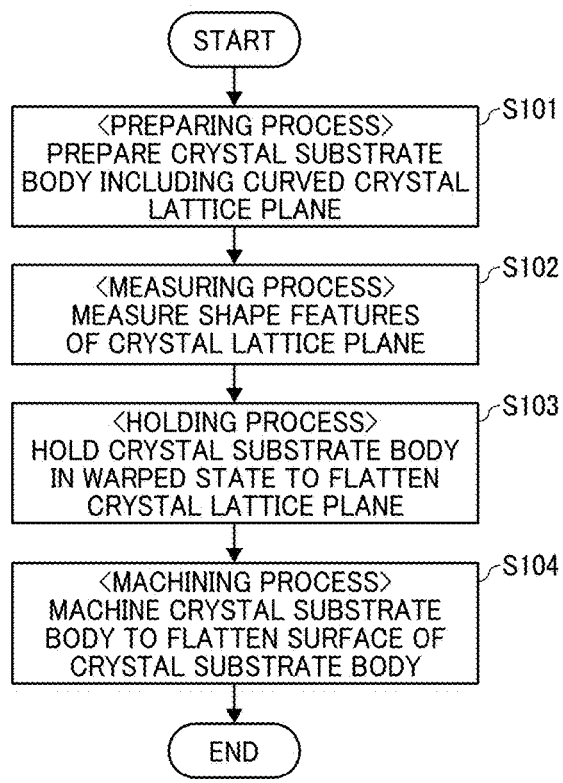
FIG. 2 is a flowchart of a flow of a method for producing the crystal substrate according to an embodiment.

FIG. 2 is a flowchart illustrating a flow of a method for producing a crystal substrate according to an embodiment of the present disclosure. The producing method according to this embodiment includes a preparing process, a measuring process, a holding process, and a machining process.

First, in the preparing process, the crystal substrate body 1 including the curved crystal lattice plane 13 is prepared (S101). The preparing process may include various processes, for example, a process of producing a new crystal substrate body 1 by a predetermined producing method, a process of cutting a part of the crystal substrate body 1 that has already been produced, and the like. The method for determining whether the crystal substrate body 1 includes the curved crystal lattice plane 13 is not limited to any particular method. For example, the presence or absence of curve may be checked using an appropriate measuring method, or it may be presumed to include the curved crystal lattice plane 13 by producing the crystal substrate body 1 according to a producing method in which it is known from experience that the curve is formed on the crystal lattice plane 13. Further, the crystal substrate body 1 including the curved crystal lattice plane 13 may be prepared, using the measurement result of the measuring process to be described later.

Next, in the measuring process, the shape features of the crystal lattice plane 13 of the prepared crystal substrate body 1 are measured (S102). It is preferable that the shape features measured here do not indicate whether the crystal lattice plane 13 is simply curved, but it is preferable that the shape features indicate features unique to each crystal substrate body 1 with relatively high accuracy. The shape features are used to select a unit used in a holding process to be described later. The shape features include information indicating whether the shape is a concave shape or a convex shape, information indicating a change in curvature (a relation between the position of the crystal lattice plane 13 and the curvature, the number of extreme values of the distribution of the off-angle, and the like) or the like. In addition, the preparing process may be performed, on the basis of the shape features measured in the measuring process.

Next, in the holding process, the crystal substrate body 1 is kept in a warped state so that the crystal lattice plane 13 is flattened (the curvature is small (the radius of curvature is large)) on the basis of the measured shape features (S103). For example, when it is known that the crystal lattice plane 13 has a concave shape in the measuring process, the crystal lattice plane 13 can be flattened by warping the crystal substrate body 1 into a convex shape. A unit for holding the crystal substrate body 1 in a warped state is not particularly limited. For example, from a plurality of jigs prepared in accordance with the patterns of the shape features of the crystal lattice plane 13, an appropriate jig may be selected and used.

Next, the front surface 11 of the held crystal substrate body 1 is machined to be flat (S104). The unit for flattening the front surface 11 is not particularly limited, and it is possible to appropriately use any known or new grinding technique or the like. However, since a defect such as a crack may occur in the crystal substrate body 1 held in the warped state depending on the process performed here, an appropriate machining method is preferably selected. A suitable machining method will be described later.

Since the shape features of the crystal lattice plane 13 and the shape features of the front surface 11 of the crystal substrate body 1 are approximated by the producing method described above, the distribution of the off-angles θ1 and θ2 can be reduced.

FIGS. 3A to 3D are illustrations of a procedure until a front surface 11A of a crystal substrate body 1A according to a first example of this embodiment is machined. FIGS. 3A to 3D illustrate a first state 51, a second state 52, a third state 53, and a fourth state 54.

The first state 51 illustrates the crystal substrate body 1A prepared by the preparing process and measured by the measuring process, and a sticking jig 21A used in the holding process. The shape features of the crystal lattice plane 13A of the crystal substrate body 1A according to this example include features having a concave shape in cross-section, and features in which a distribution of the off-angle has one minimum value (one maximum value of radius of curvature) in an approximately central portion. The front surface 11A and a back surface 12A of the crystal substrate body 1A according to this example are both flat and parallel to each other. The sticking jig 21A is a tool for holding the crystal substrate body 1A in a warped state, and is selected based on the shape features of the crystal lattice plane 13A. The sticking jig 21A according to this example has a convex abutting surface 22A.

The second state 52 illustrates a state in which the crystal substrate body 1A is held on the sticking jig 21A in a warped state. By sticking the back surface 12A of the crystal substrate body 1A to the abutting surface 22A of the sticking jig 21A, the entire crystal substrate body 1A is curved into a convex shape. At this time, the crystal lattice plane 13A is more flattened than an initial state (at the time of the preparing process) with the curve of the crystal substrate body 1A. The front surface 11A of the crystal substrate body 1A is curved along the shape of the abutting surface 22A, similarly with the back surface 12A.

The third state 53 illustrates a state in which the front surface 11A of the crystal substrate body 1A held by the sticking jig 21A is flattened by grinding or the like.

The fourth state 54 illustrates a state of the crystal substrate body 1A detached from the sticking jig 21A. The crystal substrate body 1A in the fourth state 54 may be used as a crystal substrate 5A as a finished product. At this time, the back surface 12A of the crystal substrate body 1A returns to a flat state, the front surface 11A curves into a concave shape, and the crystal lattice plane 13A curves in a slightly concave shape from the third state 53. The curvature of the crystal lattice plane 13A in the fourth state 54 is smaller than the curvature of the crystal lattice plane 13A in the first state 51. The shape similarity between the front surface 11A and the crystal lattice plane 13A in the fourth state 54 is higher than the shape similarity between the front surface 11A and the crystal lattice plane 13A in the first state 51. As a result, the distribution of the off-angle on the front surface 11A in the fourth state 54 is smaller than the distribution of the off-angle on the front surface 11A in the first state 51.

FIGS. 4A to 4D are illustrations of a procedure until the front surface 11B of the crystal substrate body 1B according to a second example of the embodiment is machined. FIGS. 4A to 4D illustrate a first state 61, a second state 62, a third state 63, and a fourth state 64.

The first state 61 illustrates a crystal substrate body 1B prepared by the preparing process and measured by the measuring process, and a sticking jig 21B used in the holding process. A crystal lattice plane 13B of the crystal substrate body 1B according to this example has shape features which have a slightly concave shape in cross-section and has the distribution of the off-angle of one minimum value (the maximum value of the radius of curvature) at the approximately central portion. The curvature of the crystal lattice plane 13B according to this example is smaller than the curvature of the crystal lattice plane 13A according to the first example illustrated in FIGS. 3A to 3D. Both the front surface 11B and the back surface 12B of the crystal substrate body 1B according to this example are curved in a direction opposite to the curved direction of the crystal lattice plane 13B. The curvatures of the curved shapes of the front surface 11B and the back surface 12B are substantially the same. The curvature of the crystal lattice plane 13B is smaller than the curvatures of the front surface 11B and the back surface 12B. A sticking jig 21B according to this example is selected on the basis of the shape features of the crystal lattice plane 13B and the shape features of the crystal substrate body 1B. The sticking jig 21B has a convex abutting surface 22B like the sticking jig 21A according to the first example illustrated in FIGS. 3A to 3D, and the curvature of the abutting surface 22B is slightly larger than the curvature of the back surface 12B.

The second state 62 illustrates a state in which the crystal substrate body 1B is held on the sticking jig 21B in a warped state. Since the curvature of the abutting surface 22B is slightly larger than the curvature of the back surface 12B, the curvature of the entire crystal substrate body 1B slightly increases by sticking of the back surface 12B to the abutting surface 22B. As a result, the crystal lattice plane 13B is further flattened from the initial state.

The third state 63 illustrates a state in which the front surface 11B of the crystal substrate body 1B held by the sticking jig 21B is flattened by grinding or the like.

The fourth state 64 illustrates a state of the crystal substrate body 1B detached from the sticking jig 21B. The crystal substrate body 1B in the fourth state 64 may be used as the crystal substrate 5B as a finished product. At this time, the shape similarity between the front surface 11B and the crystal lattice plane 13B is higher than the shape similarity in the first state 61. As a result, the distribution of the off-angle on the front surface 11B in the fourth state 64 is smaller than the distribution of the off-angle on the front surface 11B in the first state 61.

FIGS. 5A to 5D are illustrations of a procedure until the back surface 12A of the crystal substrate body 1A (crystal substrate 5A) according to the first example of the embodiment is machined. FIGS. 5A to 5D illustrate a first state 71, a second state 72, a third state 73, and a fourth state 74.

Figure 3A:
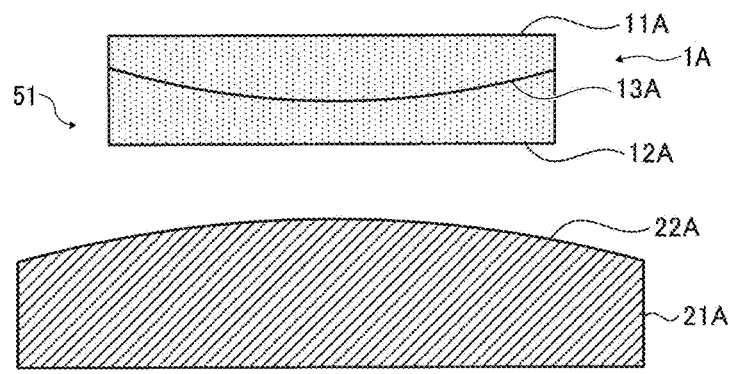
FIGS. 3A to 3D are illustrations of a procedure until a front surface of a crystal substrate according to a first example of the embodiment is machined.
Figure 3B:
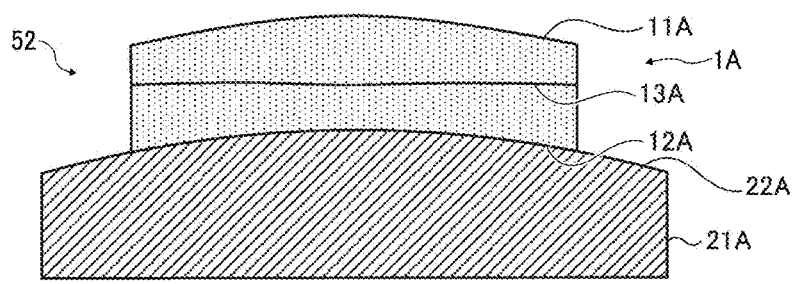
Figure 3C:
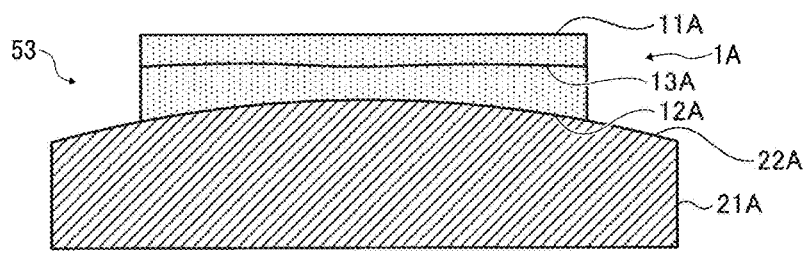
Figure 3D:
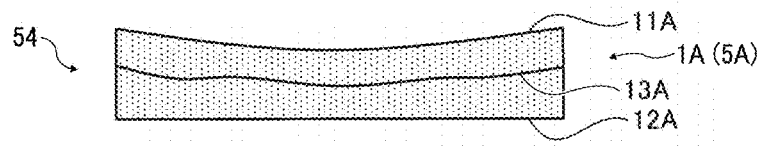

The first state 71 illustrates the crystal substrate body 1A in the fourth state 54 of FIG. 3D, and the sticking jig 31 used for machining the back surface 12A of the crystal substrate body 1A. The sticking jig 31 has a flat abutting surface 32. The crystal substrate body 1A is disposed so that the front surface 11A faces downward (to face the abutting surface 32).

The second state 72 illustrates a state in which the crystal substrate body 1A is held by sticking of the front surface 11A to the abutting surface 32 of the sticking jig 31. At this time, the curved front surface 11A and the crystal lattice plane 13A having a high shape similarity with the front surface 11A are flattened, and the back surface 12A has a curved shape.

In the third state 73, the back surface 12A of the crystal substrate body 1A held by the sticking jig 31 is flattened by grinding or the like.

The fourth state 74 illustrates a state of the crystal substrate body 1A detached from the sticking jig 31. The crystal substrate body 1A in the fourth state 74 may be used as the crystal substrate 5A as a finished product. At this time, the front surface 11A and the crystal lattice plane 13A flattened by the sticking jig 31 return to the curved state, and the back surface 12A flattened in the third state 73 has a curved shape. As a result, all of the front surface 11A, the back surface 12A, and the crystal lattice plane 13A have substantially the same curved shape. Thus, all of the surfaces have high shape similarity with each other.

FIGS. 6A to 6D are illustrations of a procedure until the back surface 12B of the crystal substrate body 1B (crystal substrate 5B) according to the second example of the embodiment is machined. FIGS. 6A to 6D illustrate a first state 81, a second state 82, a third state 83, and a fourth state 84.

Figure 4A:
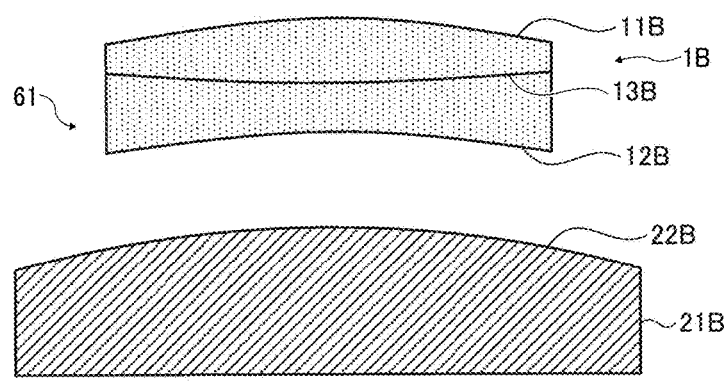
FIGS. 4A to 4D is a view illustrating a procedure until a front surface of a crystal substrate according to a second example of the embodiment is machined.
Figure 4B:
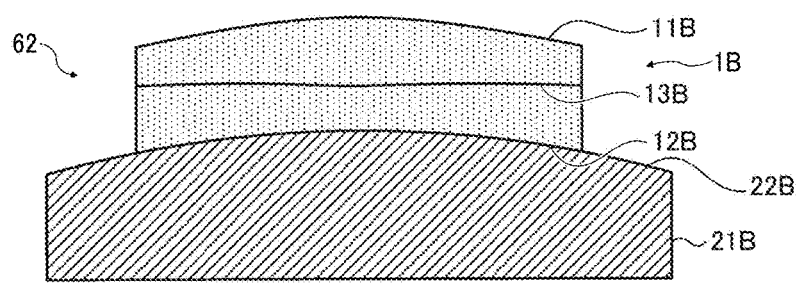
Figure 4C:
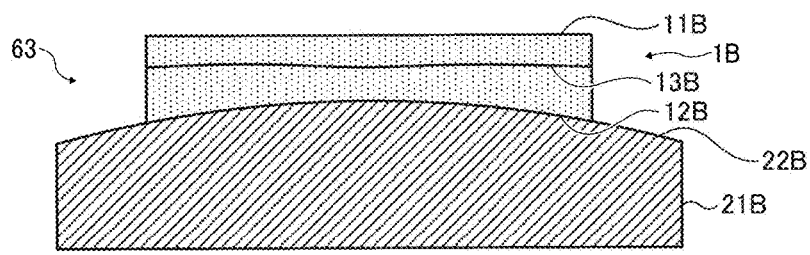
Figure 4D:
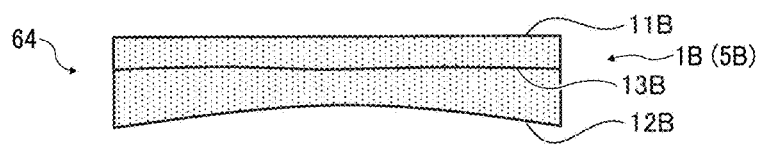
Figure 5A:
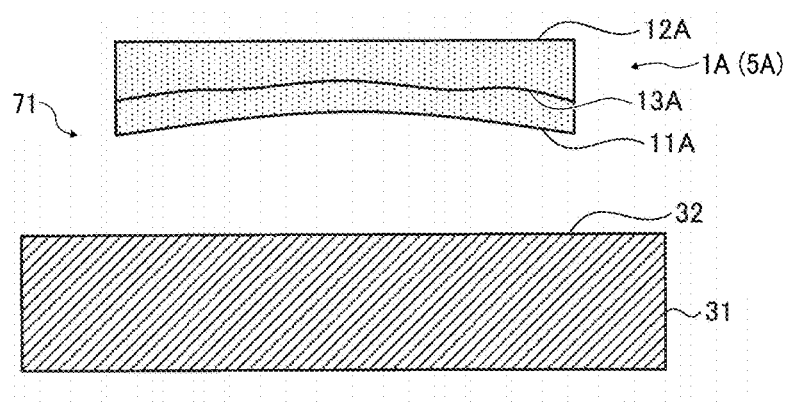
FIGS. 5A to 5D are illustrations of a procedure until a back surface of the crystal substrate according to the first example of the embodiment is machined.
Figure 5B:
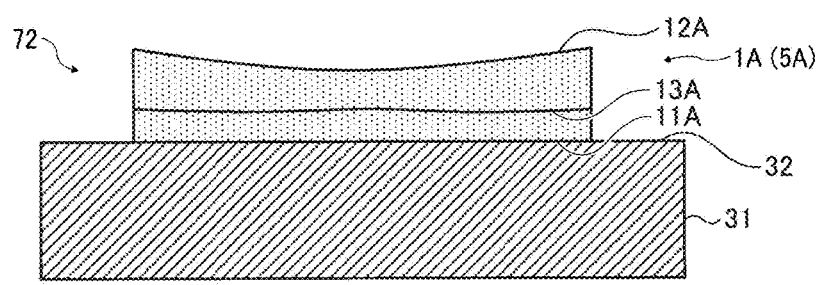
Figure 5C:
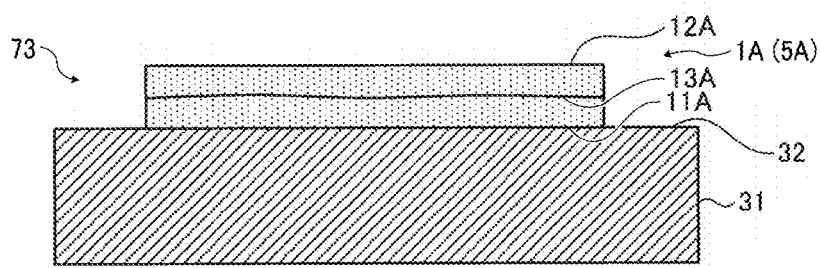
Figure 5D:
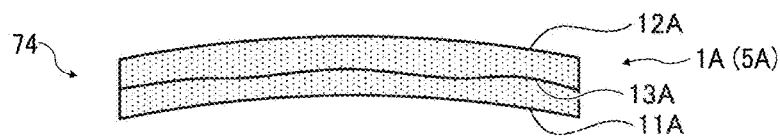
Figure 6A:
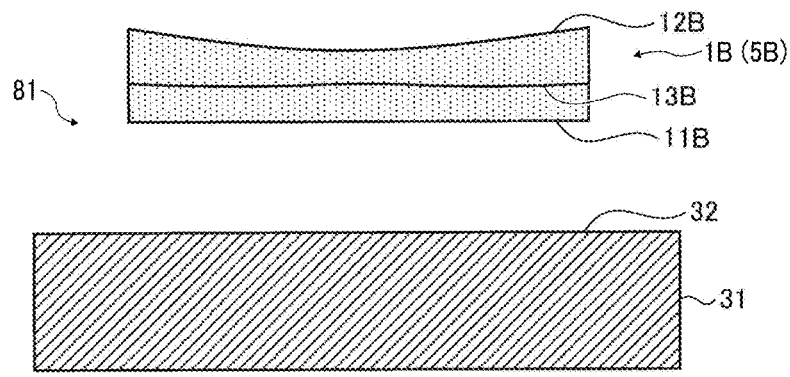
FIGS. 6A to 6D are illustrations of a procedure until the back surface of the crystal substrate according to the second example of the embodiment is machined.
Figure 6B:
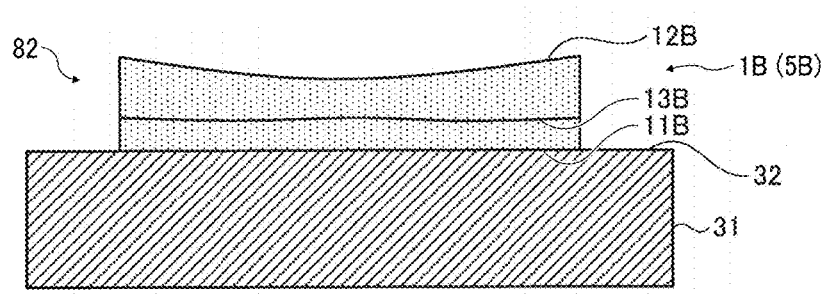
Figure 6C:
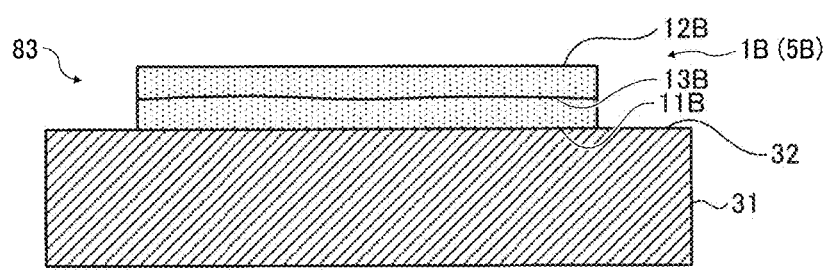
Figure 6D:
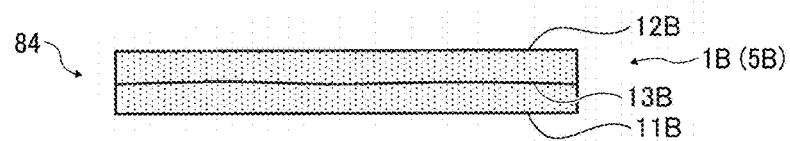

The first state 81 illustrates the crystal substrate body 1B in the fourth state 64 of FIG. 4D, and the sticking jig 31 which is used for machining the back surface 12B of the crystal substrate body 1B and is similar to one illustrated in FIGS. 5A to 5C. The crystal substrate body 1B is disposed so that the front surface 11B faces downward (to face the abutting surface 32).

The second state 82 illustrates a state in which the crystal substrate body 1B is held by sticking of the front surface 11B to the abutting surface 32 of the sticking jig 31. The front surface 11B of the crystal substrate body 1B according to this example is substantially flat. Therefore, the front surface 11B and the crystal lattice plane 13B are maintained in a substantially flat state even after being held by the sticking jig 31.

The third state 83 illustrates a state in which the back surface 12B of the crystal substrate body 1B held by the sticking jig 31 is flattened by grinding or the like.

The fourth state 84 illustrates a state of the crystal substrate body 1B detached from the sticking jig 31. The crystal substrate body 1B in the fourth state 84 may be used as the crystal substrate 5B as a finished product. At this time, all of the front surface 11B, the back surface 12B, and the crystal lattice plane 13B are substantially flat.

The type of crystal substrate bodies 1A and 1B (crystal substrates 5A and 5B) according to the present embodiment is not particularly limited, and various types of substrates forming the off-angle by the front surfaces 11A and 11B and the crystal lattice plane 13 are an object of this embodiment. As the type of the crystal substrate bodies 1A and 1B, for example, a single crystal substrate made of gallium nitride, sapphire, silicon carbide, and the like are adopted.

In the first and second examples of the present embodiment, the crystal substrate bodies 1A and 1B are used in a warped state, using the sticking jigs 21A and 21B having the abutting surfaces 22A and 22B having the curved surface shape. For this reason, there is a risk of breakage, such as cracks and ruptures, in the crystal substrate bodies 1A and 1B at the time of holding and detaching the crystal substrate bodies 1A and 1B. The possibility of such breakage is reduced by holding and detaching the crystal substrate bodies 1A and 1B in a state in which the number of work-affected layers of the front surfaces 11A and 11B and the back surfaces 12A and 12B decreases. When the thickness (depth) of the work-affected layer is 1 μm or less, it is possible to almost certainly prevent breakage of the crystal substrate bodies 1A and 1B at the time of holding and detaching. Evaluation of the work-affected layer can be performed, for example, by observation with a microscope and transmission electron microscope (TEM) and the like of the cross-section of the crystal substrate bodies 1A and 1B, measurement of stress with the microscopic Raman spectroscopic measurement device, measurement with an X-ray Rocking Curve (XRC) method, measurement with an X-ray reflectance method, or the like.

By repeating the procedures as illustrated in FIGS. 3A through 6D, it is possible to further improve the distribution of the off-angle.

Example 1

Specific examples of the above producing method are described below.

<Substrate Preparing Process>

Figure 7:
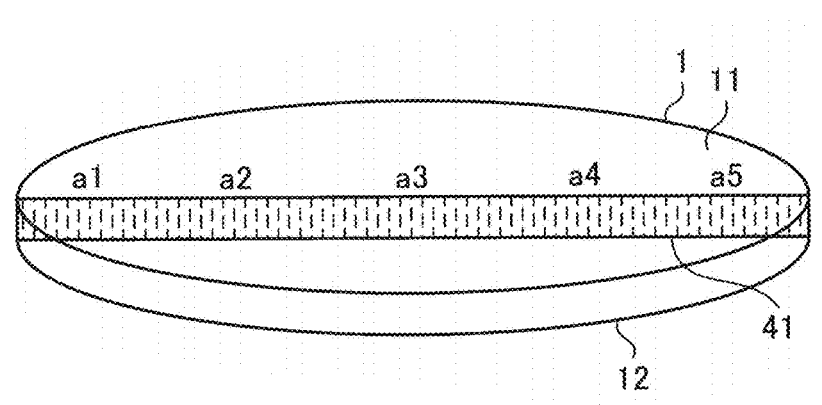
FIG. 7 is a perspective view illustrating a shape of the crystal substrate according to the first example.

A crystal substrate body 1 made of GaN having a thickness of 500 μm and a c-plane having a diameter of 2 inches (50.8 mm), that is, a (0001) plane as a main surface was prepared. FIG. 7 is a perspective view illustrating the shape of the crystal substrate body 1 according to Example 1. The front surface 11 of the crystal substrate body 1 according to Example 1 is a Ga surface, and the crystal lattice plane which is the (0001) plane when the front surface 11 is directed upward is warped in a concave shape. FIG. 7 illustrates an a-plane cross-section 41. The Ga surface (front surface 11) and an N surface (back surface 12) of the crystal substrate body 1 are finished by chemical mechanical polishing (CMP). An orientation flat indicating a crystal orientation is applied to the crystal substrate body 1.

<Crystal Lattice Plane Measuring Process>

Figure 8:
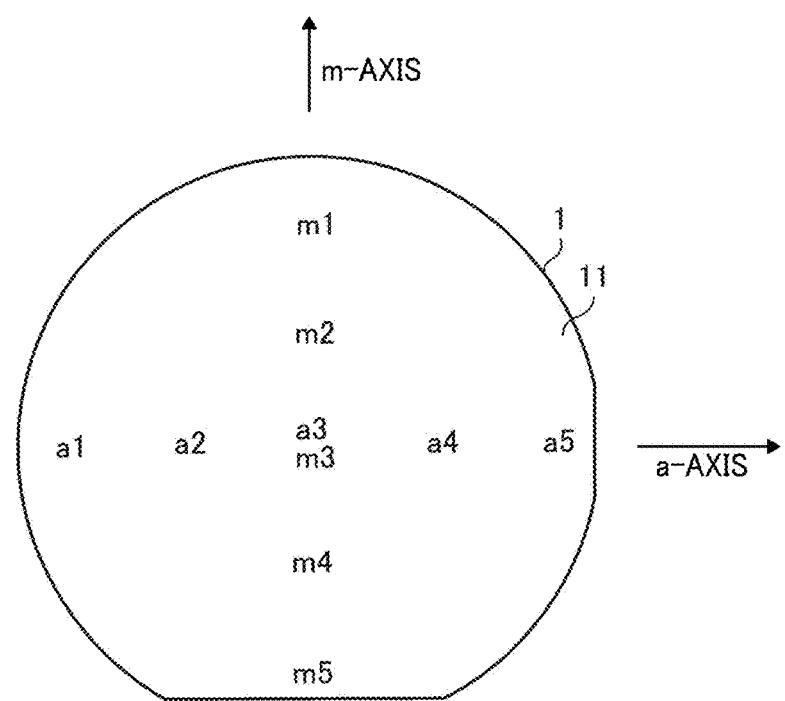
FIG. 8 is a top view illustrating measurement locations in the crystal substrate according to the first example.

Distribution (shape features) of a (0002) crystal lattice plane from the front surface 11 side was measured, using an X-ray diffraction apparatus of Kα ray of Cu as a radiation source. The crystal lattice plane distribution was grasped by measuring five points at an interval of 12 mm along the a-axis <11-20> and 5 points at an interval of 12 mm along the m-axis <1-100>. FIG. 8 is a top view illustrating the measurement locations in the crystal substrate body 1 according to Example 1. Measurement points along the a-axis are set as a1 to a5, and measurement points along the m-axis are set as m1 to m5, respectively. The a3 and the m3 are the same location.

The off-angle at each measurement point was evaluated by the XRC method. The results are illustrated in Table 1.

TABLE 1

| Measurement point | a1 | a2 | a3 | a4 | a5 | Radius of curvature (m) |
|---|---|---|---|---|---|---|
| a-axis direction | −0.32 | −0.11 | 0.06 | 0.22 | 0.32 | 4.3 |
| m-axis direction | 0.27 | 0.27 | 0.27 | 0.26 | 0.27 | — |

| Measurement point | m1 | m2 | m3 | m4 | m5 | Radius of curvature (m) |
|---|---|---|---|---|---|---|
| a-axis direction | 0.27 | 0.27 | 0.27 | 0.26 | 0.27 | — |
| m-axis direction | 0.62 | 0.45 | 0.27 | 0.13 | 0.01 | 4.5 |

From the measurement results illustrated in Table 1, the off-angle is distributed around 0.06° of a3 in the a-axis direction, and the off-angle is distributed around 0.27° of m3 in the m-axis direction. It is revealed that that the crystal lattice plane is curved concavely as viewed from the front surface 11 side as illustrated in FIGS. 3A to 3D in both the a-axis direction and the m-axis direction. The radius of curvature was calculated as an index for evaluating the distribution of the off-angle of the concave shape. The radius of curvature was calculated from the amount of angle change of the distance 48 mm between a1 and a5 in the a-axis direction, and the radius of curvature as calculated from the distance 48 mm between m1 and m5 and the amount of angle change in the m-axis direction. As a result, the radius of curvature in the a-axis direction was 4.3 m and the radius of curvature in the m-axis direction was 4.5 m.

<Substrate Holding Process>

From the measurement result of the radius of curvature of the off-angle in the crystal lattice plane measurement process, a sticking jig having a convex abutting surface and a radius of curvature of 5.0 m was selected. The process of sticking the crystal substrate body 1 to the abutting surface includes a process of heating the abutting surface of the sticking jig to melt the hot melt wax, a process of placing the crystal substrate body 1 on the hot melt wax, a process of removing bubbles between the crystal substrate body 1 and the abutting surface by evacuating, a process of pressurizing the crystal substrate body 1 from above with a silicone rubber, and a process of cooling in a state in which the crystal substrate body 1 and the abutting surface are in close contact with each other. The central portion of the crystal substrate body 1 bonded to the sticking jig was higher than the edge portion, and a difference in height between the central portion and the edge portion was 65 μm.

<Front Surface Flattening Process>

Next, the front surface 11 was subjected to grinding, using a #600 grindstone. The front surface 11 was flattened by grinding about 70 μm from the central portion of the crystal substrate body 1. After grinding, the sticking jig was heated to peel off the crystal substrate body 1 and cleaned.

Thereafter, in order to check the change in the distribution of the off-angle on the front surface 11, the same evaluation as the above-described crystal lattice plane measurement process was performed. The results are illustrated in Table 2.

TABLE 2

| Measurement point | a1 | a2 | a3 | a4 | a5 | Radius of curvature (m) |
|---|---|---|---|---|---|---|
| a-axis direction | −0.07 | −0.01 | 0.06 | 0.06 | 0.07 | 19.6 |
| m-axis direction | 0.27 | 0.27 | 0.27 | 0.26 | 0.27 | — |

| Measurement point | m1 | m2 | m3 | m4 | m5 | Radius of curvature (m) |
|---|---|---|---|---|---|---|
| a-axis direction | 0.27 | 0.27 | 0.27 | 0.26 | 0.27 | — |
| m-axis direction | 0.27 | 0.26 | 0.27 | 0.27 | 0.26 | 275.0 |

From the measurement results illustrated in Table 2, it is found that the radius of curvature in the a-axis direction was 19.6 m, the radius of curvature in the m-axis direction was 275.0 m, the radius of curvature was larger than the measurement result illustrated in Table 1, and the flatness was improved. Increases in the radius of curvature in the a-axis direction and the m-axis direction mean that the distribution of the off-angle of the crystal substrate body 1 is reduced by the front surface flattening process.

<Back Surface Flattening Process>

Thereafter, the back surface 12 was machined to make the thickness of the crystal substrate body 1 uniform. First, the crystal substrate body 1 was stuck to the abutting surface of the sticking jig with the back surface 12 facing upward. In this case, the back surface 12 was bonded to the abutting surface by the same procedure as the substrate holding process, using a sticking jig having a flat abutting surface. Thereafter, the grinding process was performed until the back surface 12 became flat. As a result, the thickness of the crystal substrate body 1 was 420 μm. Thereafter, the crystal substrate body 1 was detached from the sticking jig and cleaned.

<Front Surface Finishing Process>

The crystal substrate body 1 was stuck to the sticking jig having the flat abutting surface so that the front surface 11 faced upward. After polishing the front surface 11 using the diamond slurry, a finishing treatment was performed to remove machining damage by the CMP. The finished crystal substrate body 1 had a thickness of 400 μm. After that, the distribution of the off-angle of the crystal substrate body 1 was evaluated again, but the result was substantially the same as the measurement result of Table 1.

Through the process as in Example 1, the radius of curvature in the a-axis direction and the m-axis direction became large, and it was possible to reduce the distribution of the off-angle of the crystal substrate body 1. By using the crystal substrate having the small distribution of off-angle, it is possible to produce a plurality of devices having uniform characteristics on the front surface 11. This makes it possible to improve the yield of the device producing and to reduce the producing cost.

Example 2

An example of a relation between the thickness of the work-affected layer on the front surface 11 of the crystal substrate body 1 held in the substrate holding process and the cracks is described below.

<Control of Work-Affected Layer>

Similarly to Example 1, a plurality of crystal substrate bodies 1 made of GaN having a thickness of 500 μm and c-plane having a diameter of 2 inches (50.8 mm), that is, a (0001) plane as a main surface was prepared. In order to control the work-affected layer of the front surface 11, the front surface 11 was polished using diamond slurries having different particle sizes to examine the depth of the work-affected layer. The depth of the work-affected layer was evaluated by observing the cross-section of the crystal substrate body 1 using the TEM.

Figure 9:
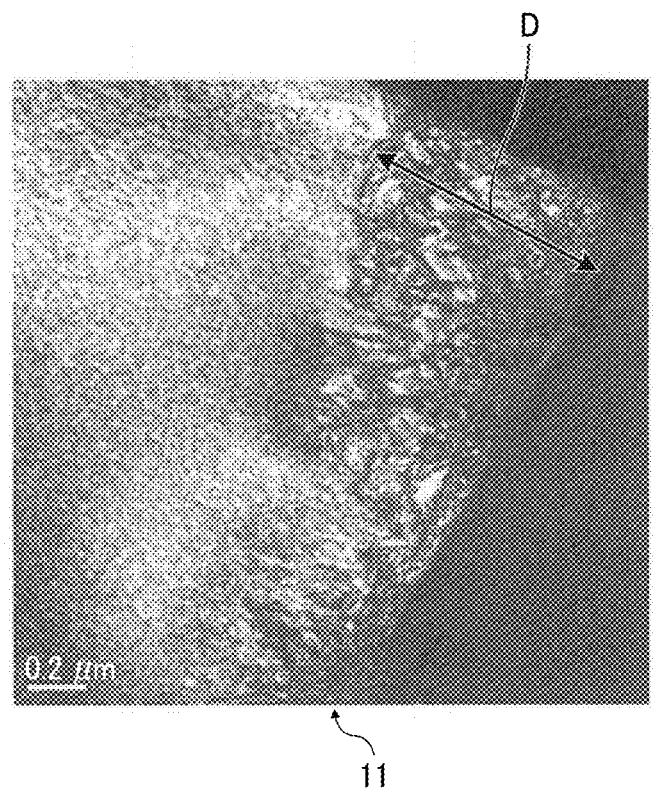
FIG. 9 is a view illustrating the thickness of a work-affected layer on the front surface of the crystal substrate according to the second example.

FIG. 9 is a view illustrating the thickness of the work-affected layer on the front surface 11 of the crystal substrate body 1 according to Example 2. FIG. 9 illustrates the observation result of TEM, which illustrates a state of the cross-section in the vicinity of the front surface 11 of the crystal substrate body 1 when the front surface was polished with a diamond slurry having a particle size of 3 μm. FIG. 9 illustrates a thickness D of the thickest part (deepest from the front surface 11) of the work-affected layer expressed by black contrast. In the example illustrated in FIG. 9, there is a relation of D=1.2 μm. Four TEM observations were made on one crystal substrate body 1, and the portion with the largest D was taken as a work-affected layer thickness to be described later. Further, the back surface 12 was in a state in which there was no work-affected layer in the CMP-finishing.

Ten crystal substrate bodies 1 were polished each time by each diamond slurry, using four types of diamond slurries with particle sizes of 1 μm, 2 μm, 3 μm, and 6 μm. The thickness of each crystal substrate body 1 was finished in a range of from 500 μm to 480 μm. The work-affected layer thickness on the front surface 11 of the crystal substrate body 1 after polishing with diamond slurry of each particle diameter was evaluated. Thereafter, the crystal substrate body 1 was held using a sticking jig having a convex abutting surface with a radius of curvature of 3.0 m. The crystal substrate body 1 was stuck in the same manner as in Example 1. After sticking, it was evaluated whether or not the crystal substrate body 1 was cracked. The evaluation results are illustrated in Table 3.

TABLE 3

|  | Particle diameter of diamond slurry (μm) | Depth of work-affected layer (μm) | Crack after sticking (number of bodies) |
| --- | --- | --- | --- |
| Example 2-1 | 1 | 0.3 | 0 |
| Example 2-2 | 2 | 0.7 | 0 |
| Comparative Example 1-1 | 3 | 1.2 | 1 |
| Comparative Example 1-2 | 6 | 2.6 | 4 |

In Table 3, Example 2-1 is an example of the case of polishing using a diamond slurry with a particle size of 1 μm, Example 2-2 is an example of the case of polishing using diamond slurry with a particle size of 2 μm, Comparative Example 1-1 is an example of the case of polishing using a diamond slurry with a particle diameter of 3 μm, and Comparative Example 1-2 is an example of the case of polishing using diamond slurry with a particle size of 6 μm. Table 3 illustrates a case where cracks did not occur in the crystal substrate body 1 after sticking in Examples 2-1 and 2-2 in the case of using diamond slurries with the relatively small particle diameters of 1 μm and 2 μm. Meanwhile, Table 3 illustrates a case where cracks occurred in the crystal substrate body 1 after sticking in Comparative Examples 1-1 and 1-2 in the case of using the diamond slurry with relatively large particle diameters of 3 μm and 6 μm. From this result, it is revealed that, as the thickness of the work-affected layer on the front surface 11 and the back surface 12 of the crystal substrate body 1 is small, damage such as cracks is less likely to occur when the crystal substrate body 1 is stuck to the sticking jig. Therefore, when the crystal substrate body 1 is stuck to the sticking jig having the abutting surface of the curved surface shape, the work-affected layers of the front surface 11 and the back surface 12 of the crystal substrate body 1 are thinned to make it possible to stick the crystal substrate body 1 without damage.

Example 3

An example is described below of a relation between the thickness of the work-affected layer on the front surface 11 of the crystal substrate body 1 and cracks when detaching the crystal substrate body 1 from the sticking jig having the abutting surface of the curved surface shape.

<Control of Work-Affected Layer>

Similarly to Example 1, a plurality of crystal substrate bodies 1 made of GaN having a thickness of 500 μm and c-plane having a diameter of 2 inches (50.8 mm), that is, a (0001) plane as a main surface was prepared. The crystal substrate body 1 was held using a sticking jig having a convex abutting surface with a radius of curvature of 3.0 m. The crystal substrate body 1 was stuck in the same manner as in Example 1. In the crystal substrate body 1, a difference in height between the central portion and the edge portion was 108 μm. Grinding was performed using a #600 grindstone. The front surface 11 was flattened by grinding about 120 μm from the central portion of the crystal substrate body 1.

Thereafter, ten crystal substrate bodies 1 were polished by diamond slurries at a time, using the four types of diamond slurries with particle sizes of 1 μm, 2 μm, 3 μm, and 6 μm. The front surface 11 of each crystal substrate body 1 was cut by 30 μm. Thereafter, the sticking jig was heated to melt the hot melt wax, and the crystal substrate body 1 was detached from the sticking jig. Evaluation was made as to whether cracks were present in the crystal substrate body 1 after detachment. The results are illustrated in Table 4.

TABLE 4

| | Particle diameter of diamond slurry (μm) | Depth of work-affected layer (μm) | Crack after sticking (number) |
|---|---|---|---|
| Example 3-1 | 1 | 0.3 | 0 |
| Example 3-2 | 2 | 0.7 | 0 |
| Comparative Example 2-1 | 3 | 1.2 | 1 |
| Comparative Example 2-2 | 6 | 2.6 | 4 |

In Table 4, Example 3-1 is an example of the case of polishing using a diamond slurry with a particle size of 1 μm, Example 3-2 is an example of the case of polishing using diamond slurry with a particle size of 2 μm, Comparative Example 2-1 is an example of the case of polishing using a diamond slurry with a particle diameter of 3 μm, and Comparative Example 2-2 is an example of the case of polishing using diamond slurry with a particle size of 6 μm. Table 4 illustrates that cracks did not occur in the crystal substrate body 1 after detachment, in Examples 3-1 and 3-2 in the case of using diamond slurries with the relatively small particle diameters of 1 μm and 2 μm. Meanwhile, Table 4 illustrates that cracks occurred in the crystal substrate body 1 after detachment in Comparative Examples 2-1 and 2-2 in the case of using diamond slurry with relatively large particle diameters of 3 μm and 6 μm. From this result, it is revealed that, as the thickness of the work-affected layer on the front surface 11 and the back surface 12 of the crystal substrate body 1 is small, damage such as cracks is less likely to occur when the crystal substrate body 1 is detached from the sticking jig.

Further, when the crystal substrate body 1 is stuck to a sticking jig having a convex abutting surface, the central portion of the crystal substrate body 1 becomes high. When polishing is performed in this state, the crystal substrate body 1 and the sticking jig become unstable. Therefore, it is desirable to grind the crystal substrate body 1 in advance to be flat. When the crystal substrate body 1 is stuck to a sticking jig having a concave abutting surface, unless the central portion of the crystal substrate body 1 and the concave central portion are not made to match each other, the height of the crystal substrate body 1 does not become uniform. Thus, the crystal substrate body 1 and the sticking jig become unstable. Even when the external shape of the crystal substrate body 1 is not a perfect round, the crystal substrate body 1 and the sticking jig become unstable. Therefore, even in such a case, it is desirable to grind the crystal substrate body 1 in advance to be flat.

As described above, when detaching the crystal substrate body 1 from the sticking jig having the abutting surface with a curved surface shape, by keeping the work-affected layer of the front surface 11 and the back surface 12 of the crystal substrate body 1 shallow, the crystal substrate body 1 can be detached without being damaged.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A method for producing a crystal substrate, the method comprising:
    (a) preparing a crystal substrate body including a curved crystal lattice plane;
    (b) measuring a shape feature of the crystal lattice plane;
    (c) sticking a back surface of the crystal substrate body to a convex or concave abutting surface and holding the crystal substrate body in a warped state to the convex or concave abutting surface in accordance with the shape feature measured in (b), to more flatten the crystal lattice plane than the crystal lattice plane prepared in (a); and
    (d) machining a front surface of the crystal substrate body held in the warped state, to flatten the front surface.

2. The method according to claim 1, wherein a distribution of an off-angle formed by the front surface of the crystal substrate body prepared in (a) and the crystal lattice plane has one extreme value.

3. The method according to claim 1, wherein the machining in (d) further comprises machining the back surface of the crystal substrate body to be parallel to the front surface.

4. The method according to claim 1, wherein a thickness of a work-affected layer of a portion machined in (d) is 1 μm or less.

5. The method according to claim 1, wherein the crystal substrate body is a single crystal substrate of group 13 nitride.

6. The method according to claim 1, wherein a shape similarity of the crystal lattice plane and the front surface of the crystal substrate body upon the machining in (d) is greater than that of the crystal lattice plane and the front surface in (a).

7. The method according to claim 1, wherein the crystal lattice plane is internal to the crystal substrate body.

8. A method for producing a crystal substrate, the method comprising:
    (aa) preparing a crystal substrate body including a curved crystal lattice plane;
    (bb) sticking a back surface of the crystal substrate body to a convex or concave abutting surface in accordance with a shape feature of the curved crystal lattice plane, to more flatten the crystal lattice plane than the crystal lattice plane of the crystal substrate body prepared in (aa); and
    (cc) machining a front surface of the crystal substrate body held in a warped state, to flatten the front surface.

9. The method according to claim 8, wherein a distribution of an off-angle formed by the front surface of the crystal substrate body prepared in (aa) and the crystal lattice plane has one extreme value.

10. The method according to claim 8, wherein the machining in (cc) further comprises machining the back surface of the crystal substrate body to be parallel to the front surface.

11. The method according to claim 8, wherein a thickness of a work-affected layer of a portion machined in (cc) is 1 μm or less.

12. The method according to claim 8, wherein the crystal substrate body is a single crystal substrate of group 13 nitride.

13. The method according to claim 8, wherein a shape similarity of the crystal lattice plane and the front surface of the crystal substrate body upon the machining in (cc) is greater than that of the crystal lattice plane and the front surface in (aa).

14. The method according to claim 8, wherein the crystal lattice plane is internal to the crystal substrate body.

15. The method according to claim 8, further comprising:
(b1) measuring a shape feature of the crystal lattice plane of one crystal substrate body; and
(b2) performing (aa), (bb) and (cc) for each of one or more other crystal substrate bodies, in which the convex or concave abutting surface employed in (bb) for said each of one or more other crystal substrate bodies corresponds to the shape feature measured in (b1) from the one crystal substrate body.

* * * * *